United States Patent [19]

McKinnon

[11] Patent Number: 4,823,084
[45] Date of Patent: Apr. 18, 1989

[54] METHOD OF DETERMINING THE SPECTRAL DISTRIBUTION OF THE NUCLEAR MAGNETIZATION IN A LIMITED VOLUME RANGE

[75] Inventor: Graeme C. McKinnon, Ellerau, Fed. Rep. of Germany

[73] Assignee: U.S. Philips Corporation, New York, N.Y.

[21] Appl. No.: 99,886

[22] Filed: Sep. 22, 1987

[30] Foreign Application Priority Data

Sep. 26, 1986 [DE] Fed. Rep. of Germany ....... 3632738

[51] Int. Cl.⁴ ............................................ G01R 33/20
[52] U.S. Cl. .................................................. 324/309
[58] Field of Search ................ 324/307, 309, 311, 312

[56] References Cited

U.S. PATENT DOCUMENTS 4,318,043 3/1982 Crooks et al. ........................ 324/309
4,558,277 12/1985 Post et al. ............................ 324/309

Primary Examiner—Tom Noland
Assistant Examiner—Kevin D. O'Shea
Attorney, Agent, or Firm—Jack E. Haken; Jack D. Slobod

[57] ABSTRACT

The invention relates to a method of determining the spectral distribution of the nuclear magnetization in a limited volume range. For this purposes, a sequence is used, which comprises a first 90° high-frequency pulse and three succeeding 180° high-frequency pulse, whose relative time spacing is equal and smaller than the time spacing of the first high-frequency pulse from the first of the 180° high-frequency pulses. The spectral distribution then obtained is strongly independent of the influence of eddy currents.

5 Claims, 2 Drawing Sheets

METHOD OF DETERMINING THE SPECTRAL DISTRIBUTION OF THE NUCLEAR MAGNETIZATION IN A LIMITED VOLUME RANGE

The invention relates to a method of determining the spectral distribution of the nuclear magnetization in a limited volume range, in which in the presence of a homogeneous stationary magnetic field at least one sequence acts upon an examination area, which sequence comprises a first high-frequency pulse and then three selective 180° high-frequency pulses succeeding each other at the same distance (interval) in time, the echo signal produced in the volume range after the last 180° pulse each time being converted into digital sample values, after which a Fourier transformation is carried out, while the invention further relates to an arrangement for carrying out the method.

Such a method is known from the "Book of Abstracts" of the Society of Magnetic Resonance in Medicine (fifth Annual Meeting, Aug. 19–22, 1986, Montreal, Vol. 3, p. 981).

By means of the first high-frequency pulse, the nuclear magnetization in the overall examination area is triggered by preferably 90°. The subsequent 180° high-frequency pulse is selective, that is to say that during this high-frequency pulse a magnetic gradient field is active, which flips only the nuclear magnetization in a layer, whose normal extends parallel to the gradient of the magnetic gradient field, by 180°, while the nuclear magnetization energized by the preceding 90° high-frequency pulse is dephased outside this layer. This nuclear magnetization therefore does not contribute to the echo signals occurring later. The second 180° high-frequency pulse is also selective, but the gradient of the magnetic gradient field then applied extends at right angles to the direction of the gradient active during the preceding 180° pulse. Finally, with the third 180° pulse of a sequence, the gradient of the magnetic gradient field extends at right angles to the gradient during the two preceding 180° pulses.

By this sequence it is achieved that the echo signal occurring after the three 180° high-frequency pulses is determined only by the nuclear magnetization in a limited volume range. This echo signal can be subjected to a Fourier transformation and the spectrum then obtained corresponds to the spectral distribution of the nuclear magnetization in the limited volume range—only in the ideal case, however. In practice, the spectrum is falsified by magnetic fields, which are variable in time and are produced by the eddy currents occurring when the magnetic gradient fields are switched. This falsification, which becomes manifest more particularly by a widening of the line of the spectrum, is the more strongly pronounced as the distance between the last 180° high-frequency pulse and the echo signal is shorter.

In the known method, a Carr-Purcell sequence is used, in which this distance is accurately equally large as the distance of the first high-frequency pulse from the next 180° high-frequency pulse, while the distances in time between the three high-frequency pulses are each time two times larger than this distance. The distance between the first high-frequency pulse and the echo signal is therefore six times larger than the distance between the first high-frequency pulse and the next 180° high-frequency pulse. Until the echo signal occurs, the nuclear magnetization in the excited range has therefore already comparatively strongly decayed so that the signal-to-noise ratio for this echo signal is comparatively unfavourable. This signal-to-noise ratio could be improved, it is true, in that the distance between the first high-frequency pulse and the next 180° high-frequency pulse is reduced, but in this case the distance between the echo signal and the last of the 180° high-frequency pulses would also be reduced, which would lead to an increase of the influence of the eddy currents produced by the gradient fields on the echo signal and on the spectrum derived therefrom, respectively.

The present invention has for its object to carry out the method mentioned in the opening paragraph in such a manner that the signal-to-noise ratio is improved and/or the influence of the eddy currents can be improved.

According to the invention, this object is achieved in that the distance in time between two successive 180° high-frequency pulses is smaller than the distance in time between the first high-frequency pulse and the next 180° high-frequency pulse.

The invention is based on the recognition of the fact that the sequence described also supplies an echo signal if the distance between the 180° high-frequency pulses is smaller than the distance between the first (non-selective) high-frequency pulse of the sequence and the succeeding selective 180° pulse—if only the relative distances in time of the three 180° high-frequency pulses are equally large. The distances in time between the first high-frequency pulse and the next succeeding 180° pulse on the one hand and between two succeeding high-frequency pulses on the other hand can then be chosen so that the distance between the first high-frequency pulse and the echo signal is reduced (which improves the signal-to-noise ratio) and/or that the distance in time between the last of the three 180° high-frequency pulses and the echo signal is enlarged (which reduces the influence of the eddy currents on the echo signal).

The influence of the eddy currents on the spectral distribution of the nuclear magnetization determined for the excited volume range can further be reduced in that, according to a further embodiment of the invention, the sequence is carried out several times, the distance in time between the first high-frequency pulse and the next 180° high-frequency pulse being varied from sequence to sequence, while the distance in time between the 180° high-frequency pulses in all sequences is kept constant, and in that each time these of the sample values of the echo signals are subjected to a Fourier transformation which have within the sequence the same distance from one of the three 180° high-frequency pulses.

In this further embodiment, not the sample values of a single echo signal, but the sample values derived from the echo signals of different sequences are consequently subjected to a Fourier transformation, which sample values are each time at the same distance from each of the three 180° high-frequency pulses and are hence in the same position in time with respect to each of the three magnetic gradient fields. It can be shown that the frequency spectrum obtained by the Fourier transformation of an echo signal corresponds to the frequency spectrum which would be obtained if the disturbing influence of the eddy currents should be absent, the individual spectral values being multiplied by a factor which depends inter alia upon the time for which the eddy currents in the relevant sequence have acted upon the nuclear magnetization. These disturbing influences are then fully eliminated if the Fourier transformation takes place because of these sample values from different sequences which have been subjected each time to the same disturbing influence by the eddy currents. This is just the case with the present invention.

It should now be noted that a similar method has already been described in German Patent Application No. P 36 07 341.5 corresponding to U.S. application Ser. No. 020,068. The sequences indicated therein contain either only two high-frequency pulses as with a spin echo method or only three high-frequency pulses for producing stimulated echo signals, however. As is stated in said patent application, the sample values used for the Fourier transformation cannot be at the same distance in time from all the magnetic gradient fields switched on and off during the preceding part of the sequence, so that a residual disturbance by eddy currents is maintained—in contrast with the present invention.

An arrangement for carrying out the method is provided with a magnet for producing a homogeneous stationary magnetic field, with a high-frequency coil system for producing a high-frequency magnetic field at right angles to the stationary magnetic field, with a high-frequency generator for feeding the high-frequency coil system, with means for producing magnetic gradient fields, with a control unit for controlling the high-frequency generator and the means for producing magnetic gradient fields and with a computer for processing nuclear magnetic resonance signals, and is characterized in that the control unit is constructed so that in each sequence a first high-frequency pulse is produced and then three further 180° high-frequency pulses are produced, the means for producing magnetic gradient fields being switched so that during each of these three 180° high-frequency pulses the gradient of the magnetic field extends in another direction and the computer unit is constructed so that it carries out a Fourier transformation with the sample values of the echo signals.

In order that the invention may be readily carried out, it will now be described more fully with reference to the accompanying drawings, in which.

Figure 1:
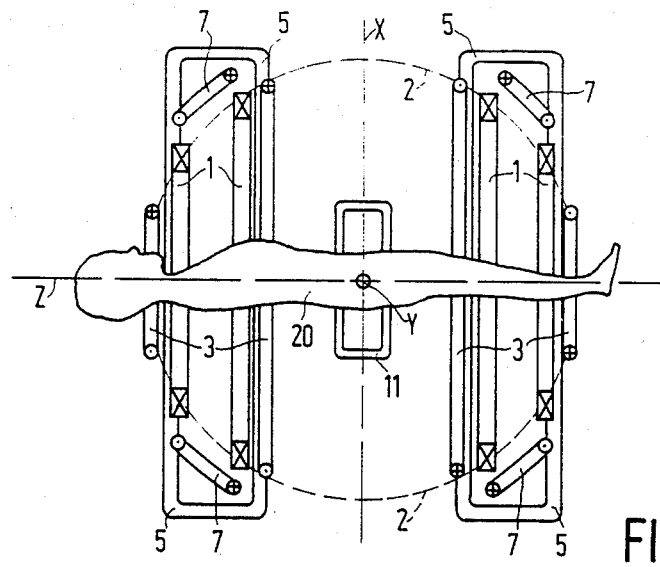
FIG. 1 shows an apparatus for medical nuclear magnetic resonance examinations, by means of which the method according to the invention can be carried out.

The nuclear magnetic resonance examination apparatus shown diagrammatically in FIG. 1 comprises an arrangement comprising four coils 1 for producing a homogeneous stationary magnetic field, which may be of the order of a few tenths of a Tesla to a few Tesla. This field extends in the z direction of a certain coordinate system. The coils 1 arranged concentrically to the z axis may be provided on a spherical surface 2. The patient 20 to be examined is situated in the interior of these coils.

For producing a magnetic field Gz extending in the z direction and linearly varying in this direction, four coils 3 are provided preferably on the same spherical surface. Further, four coils 7 are provided, which produce a magnetic gradient field Gx, which also extends in the z direction (i.e. a magnetic field, whose strength varies linearly in one direction), but whose gradient extends in the x direction. A magnetic gradient field Gy extending in the z direction and having a gradient in the y direction is produced by four coils 5, which may have the same shape as the coils 7, but which are arranged so as to be offset by 90° with respect thereto. In FIG. 1 only two of these four coils are shown.

Since each of the three coil arrangements 3, 5 and 7 for producing the magnetic gradient fields Gz, Gy and Gx is arranged symmetrically to the spherical surface 2, the field strength at the centre of the sphere, which constitutes at the same time the coordinate origin of the said cartesian xyz coordinate system, is determined only by the stationary homogeneous magnetic field of the coil arrangement 1. Further, a high-frequency coil 11 is arranged symmetrically to the plane z=0 of the coordinate system, which is constructed so that a substantially homogeneous high-frequency magnetic field extending in the z direction, i.e. at right angles to the direction of the stationary homogeneous magnetic field, is produced thereby. A modulated high-frequency current is supplied by a high-frequency generator to the high-frequency coil during each high-frequency pulse. After three high-frequency pulses, the high-frequency coil 11 serves to receive the echo signal produced at the examination area. Instead thereof, however, a separate high-frequency reception coil may also be used.

Figure 2:
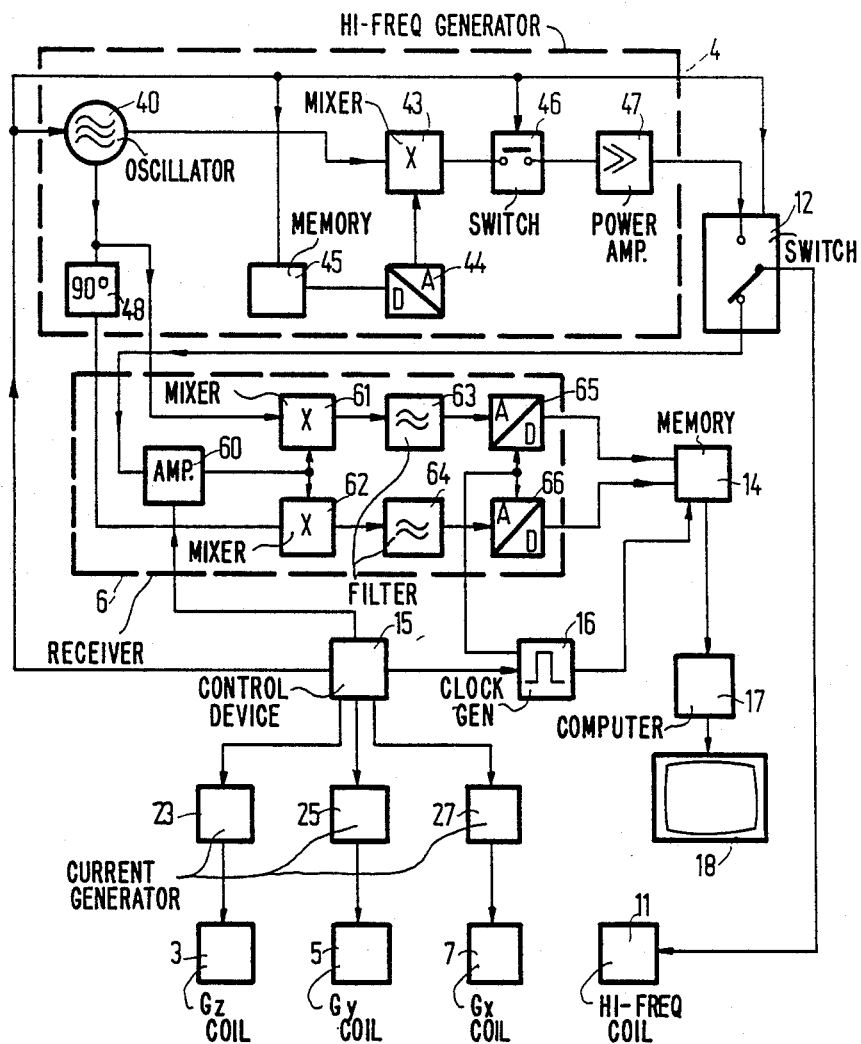
FIG. 2 shows a block circuit diagram of such an apparatus.

FIG. 2 shows a simplified block circuit diagram of this nuclear magnetic resonance examination apparatus. The high-frequency coil 11 is connected through a change-over (switch) device 12 on the one hand to a high-frequency generator 4 and on the other hand to a high-frequency receiver 6.

The high-frequency generator 4 comprises a high-frequency oscillator 40, which can be digitally controlled in frequency and which supplies oscillations having a frequency equal to the Larmor frequency of the atom cores to be excited at the field strength produced by the coils 1. The Larmor frequency f can be calculated, as is known, according to the relation $f=cB$, where B is the magnetic induction in the stationary homogeneous magnetic field and c is the gyro-magnetic ratio, which, for example, for protons is 42.56 MHz/T. The output of the oscillator 40 is connected to an input of a mixer stage 43. A second input signal is supplied to the mixer stage 43 by a digital-to-analogue converter 44, whose output is connected to a digital memory 45. Under the control of a control device 15, a sequence of digital data words representing an envelope signal is read out from the memory.

The mixer stage 43 processes the input signals supplied to it in such a manner that the carrier oscillation modulated with the envelope signal appears at its output. The output signal of the mixer stage 43 is supplied through a switch 46 controlled by the control device 15 to a high-frequency power amplifier 47, whose output is connected to the change-over device 12. The latter is also controlled by the control device 15.

The receiver 6 comprises a high-frequency amplifier 60, which is connected to the change-over device and to which is supplied the stimulated echo signal induced in the high-frequency coil 11, in which event the change-over device must have the corresponding switching position. The amplifier 60 has a mute switching input, which is controlled by the control device 15 and through which it can be cut off so that the amplification is substantially zero. The output of the amplifier is connected to the first inputs of two multiplicative mixer stages 61 and 62, which each time supply an output signal corresponding to the product of their input signals. A signal having the frequency of the oscillator 40 is supplied to the second inputs of the mixer stages 61 and 62, a phase shift of 90° existing between the signals at the two inputs. This phase shift is produced by means of a 90° phase shift element 48, whose output is connected to the input of the mixer stage 62 and whose input is connected to the input of the mixer stage 61 and to the output of the oscillator 40.

The output signals of the mixer stages 61 and 62 are supplied through low-pass filters 63 and 64, which suppress the frequency supplied by the oscillator 40 and all the frequencies lying above it and pass low-frequency components, each to an analogue-to-digital converter 65 and 66, respectively. The latter converts the analogue signals of the circuit 61...64 constituting a quadrature demodulator into digital data words, which are supplied to a memory 14. The analogue-to-digital converters 65 and 66 as well as the memory 14 receive their clock pulses from a clock pulse generator 16, which can be blocked and released, respectively, via a control lead by the control device 15, so that only in a measuring interval defined by the control device 15 the signals supplied by the high-frequency coil 11 and transposed to the low-frequency range can be converted into a sequence of digital data words and can be stored in the memory 14.

The three coil arrangements 3, 5 and 7 are each time fed by current generators 23, 25 and 27 with a current, whose variation with time can be controlled by the control unit 15. The data words or sample values stored in the memory 14 are supplied to a computer 17, which determines therefrom by a discrete Fourier transformation the spectral distribution of the nuclear magnetization and passes it on to a suitable display unit, for example a monitor 18.

Figure 3:
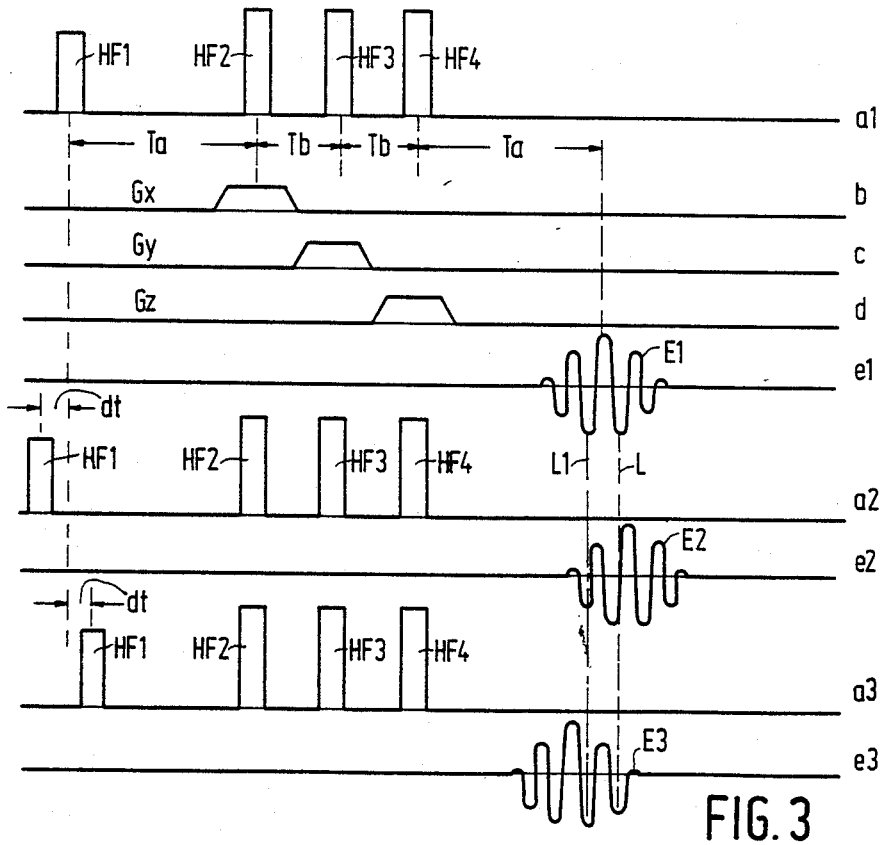
FIG. 3 shows the variation with time of different signals in the method according to the invention.

FIG. 3 shows the variation with time of different signals received with the circuit shown in FIG. 2 or produced by this circuit for the method according to the invention. The first line a1 shows the variation with time of the output signal of the high-frequency producer 4 in a (first) sequence. The sequence comprises a first high-frequency pulse HF1, which is preferably a 90° pulse, that is to say that the nuclear magnetization is flipped by it at the examination area by 90° with respect to the direction of the homogeneous stationary magnetic field. A time interval Ta later, a 180° pulse HF2 follows, which is followed after a time interval Tb by a further 180° pulse HF3, after which—again a time interval Tb later—a third 180° pulse follows.

In the known method mentioned in the opening paragraph, the time interval Tb is each time twice the time interval Ta. The first echo signal produced by the 180° pulse HF2 and occurring at the instant Ta after this high-frequency is "mirrored" by the following 180° pulse HF3 so that at the instant Ta after the high-frequency pulse HF3 a further echo signal occurs, which in turn is again mirrored by the following 180° pulse and results in a third echo signal. This method could be repeated by means of a fourth 180° pulse and, as the case may be, further 180° pulses, which follow the preceding pulses each time at a distance of 2Ta. On the contrary, according to the invention, the distance in time Tb between the 180° high-frequency pulses HF2 and HF3 and HF3 and HF4, respectively, is smaller than the distance in time Ta between the 90° high-frequency pulse HF1 and the next 180° pulse HF2. The operation of the sequence in accordance with the invention can be explained as follows: Under the influence of the inevitable inhomogeneities of the stationary magnetic field produced by the coil arrangement, the nuclear magnetization is dephased after the 90° high-frequency pulse in the range energized by this pulse. As a result, the amplitude of the nuclear magnetic resonance signal of the so-called FID signal produced at the examination area after the said high-frequency pulse decreases comparatively rapidly. The next 180° pulse HF2 ensures, as is known, that the dephasing is reversed to a rephasing, which—if further high-frequency pulses should not follow—would produce a spin echo signal at the instant Ta after the 180° pulse HF2. However, this does not happen because at the distance in time Tb after the 180° high-frequency pulse HF2 the further 180° high-frequency pulse HF3 already occurs. This 180° pulse terminates the rephasing and ensures that the dephasing is started again until at the distance in time Tb from this 180° pulse the third 180° high-frequency pulse HF4 occurs, which terminates the dephasing and initiates a rephasing. Since the time interval of dephasing after the 180° high-frequency pulse HF3 is accurately as long as the time interval of rephasing after the high-frequency pulse HF2, the effect of the two 180° high-frequency pulses HF2 and HF3 is just eliminated at the instant of the occurrence of the high-frequency pulse HF4 so that the nuclear magnetization is in the same position during the third 180° high-frequency pulse as during the second 180° high-frequency pulse (when the T2 decay is neglected). Consequently, the dephasing starting after the 90° high-frequency pulse HF1 due to the inhomogeneity of the stationary magnetic field is eliminated at the distance in time Ta from the third 180° high-frequency pulse HF4 so that at this instant a (spin) echo signal E1 occurs (compare line e1). At each of the three 180° pulses, one of the three gradient coil arrangements 3, 5 and 7 is switched on and off. The operation of switching on and off takes place each time before and after the associated high-frequency pulse, respectively, so that the variation with time of the magnetic gradient field is symmetrical to the variation with time of the associated high-frequency pulse. According to line b, during the first 180° high-frequency pulse HF2, the current generator 27 is switched on so that the coil arrangement 7 produces a magnetic gradient field Gx having a gradient extending in the x direction. In a similar manner, the second high-frequency pulse HF3 is accompanied by the magnetic gradient field Gy and the third high-frequency pulse HF4 is accompanied by the magnetic gradient field Gz (compare lines c and d).

Consequently, the 90° high-frequency pulse is a non-selective pulse because during this pulse no magnetic gradient field is active, while the 180° pulses HF2, HF3 and HF4 are layer-selective pulses, which excite the nuclear magnetization in three orthogonal layers and which dephase the nuclear magnetization excited outside these layers by the preceding high-frequency pulses of the sequence. Consequently, the echo signal E1 depends substantially only upon the nuclear magnetization in a limited volume range, which is determined by the sectional area of the three layers. This echo signal can be subjected in known manner to a Fourier transformation, from which the spectrum of the nuclear magnetization excited in the limited volume range is obtained.

As already stated, the variation with time of the echo signal E1 (and hence also the variation of the spectrum calculated therefrom by Fourier transformation) is falsified by the magnetic fields variable in time, which are caused by the eddy currents occurring when switching the magnetic gradient fields Gx, Gy and Gz. The influence of these eddy currents can be reduced, it is true, in that the distance Ta between the 90° high-frequency pulse HF1 and the 180° high-frequency pulse HF2 is enlarged, because in this case the distance in time of the echo signal E1 from the third 180° high-frequency pulse HF4 is correspondingly enlarged and the eddy current have then already decayed more strongly, but the amplitude of the echo signal E1 then decreases because of the inevitable T2 decay.

In order to fully eliminate the disturbing influence of the eddy currents on the spectrum determined by Fourier transformation, the sequence described is repeated, in which event only the distance between the 90° high-frequency pulse HF1 and the following 180° high-frequency pulse HF2 is varied by the time period dt, while relative distance in time of the high-frequency pulses HF2, HF3 and HF4 remains unchanged, like the position in time of the magnetic gradient fields Gx, Gy and Gz with respect to these pulses. The variation with time of the magnetic gradient fields is therefore not shown once more; on the contrary, the line a2 shows the variation with time of the high-frequency pulses at a distance in time enlarged by dt between HF1 and FH2, while the line a3 shows this variation with time for a distance reduced by dt. Due to the enlargement and the reduction, respectively, of the distance between HF1 and HF2, the distance between the last 180° high-frequency pulse HF4 and the echo signal is also enlarged (compare E2 in the line e2) and reduced, respectively.

The clock generator 16 is controlled by a control signal of the control unit 15 in such a manner that it is released only during the occurrence of the echo signals E1...E3. The output signals of the low-pass filters 63 and 64 (i.e. the real and imaginary parts of the echo signals E1, E2 and E3) are then converted into digital sample values and stored in the memory 14.

The computer 17 is programmed so that it subjects the sample values in the individual sequences, which each time occur at the same distance in time from the 180° high-frequency pulse HF4,—for example the sample values interconnected in FIG. 3 by the line L—to a Fourier transformation, after which they have been ordered in ascending or descending succession corresponding to the distance in time between the first high-frequency pulse HF1 and the next 180° pulse HF2 (in the example of FIG. 3 therefore either E3-E1-E2 or E2-E1-E3). Consequently, not the sequence of the sample values of a single echo signal is subjected to a Fourier transformation, but those sample values of different echo signals are subjected to a Fourier transformation, with which the disturbing influence of the eddy currents was active each time during the same time interval within a sequence. It can be shown that the frequency spectrum obtained by such a Fourier transformation corresponds to the frequency spectrum which would be obtained with the Fourier transformation of an individual echo signal sampled with the distance in time dt if the eddy currents were not present.

If of the individual echo signals a sample value occurring each time at another instant—for example, at the instant determined by the dot-and-dash line L1—should be subjected to a Fourier transformation, in the ideal case the same frequency spectrum would have to be obtained. Because of inevitable errors during recording and processing of measuring values, however, deviations are obtained, which can be reduced in that several sequences of sample values are subjected to the Fourier transformation, each sequence comprising only sample values which are at the same distance in time from the high-frequency pulse, and in that the frequency spectra thus obtained and slightly deviating from each other are added to each other.

If a Fourier transformation is carried out with only three supporting points, in the embodiment shown in FIG. 3, only a very coarse spectral resolution is obtained. For an improved resolution a considerably larger number of supporting points and hence a correspondingly larger number of sequences are required.

What is claimed is:

1. A method of determining the spectral distribution of the nuclear magnetization in a limited volume range, in which in the presence of a homogeneous stationary magnetic field at least one sequence acts upon an examination area, which sequence comprises a first high-frequency pulse and then three selective 180° high-frequency pulses succeeding each other at equal intervals of time, each of said three high-frequency pulses occurring in conjunction with a magnetic gradient field, the gradient extending in a different one of three orthogonal directions during each of said three pulses, the echo signal produced in the volume range after the last 180° pulse being each time converted into digital sample values, after which a Fourier transformation is carried out, where the time interval (Tb) between two successive 180° high-frequency pulses is smaller than the time interval (Ta) between the first high-frequency pulse and the next 180° high-frequency pulse.

2. A method of determining the spectral distribution of the nuclear magnetization in a limited volume range, in which in the presence of a homogeneous stationary magnetic field at least one sequence acts upon an examination area, which sequence comprises a first high-frequency pulse and then three selective 180° high-frequency pulse succeeding each other at equal intervals of time, the echo signal produced in the volume range after the last 180° pulse being each time converted into digital sample values, after which a Fourier transformation is carried out, where the time interval (Tb) between two successive 180° high-frequency pulses is smaller than the time interval (Ta) between the first high-frequency pulse and the next 180° high-frequency pulse and the sequence is carried out several times, the time interval between the first high-frequency pulse (HF1) and the next 180° high-frequency pulse (HF2) being varied from sequence to sequence, while the time interval between the high-frequency pulses ($HF_2$-$HF_3$-$HF_4$) in all sequences is kept constant, and wherein each time those of the sample values of the echo signals (E1, E2, E3) are subjected to a Fourier transformation, which have within the sequence the same interval from one of the three 180° high-frequency pulses.

3. A method as claimed in claim 1 or 2, characterized in that several sequences of sample values are subjected to a Fourier transformation, the sample values of a sequence each time having the same time interval from one of the three 180° high-frequency pulses of the respective sequence, and in that the spectral distributions resulting therefrom are added to each other.

4. An arrangement for carrying out the method claimed in claim 1 or claim 2 comprising a magnet for producing a homogeneous stationary magnetic field, a high-frequency coil system for producing a high-frequency magnetic field at right angles to the stationary magnetic field, a high-frequency generator for feeding the coil arrangement, means for producing magnetic gradient fields, a control unit for controlling the high-frequency generator and the means for producing magnetic gradient fields and a computer for processing nuclear magnetic resonance signals, characterized in that the control unit is constructed so that in each sequence a first high-frequency pulse is produced and then three further 180° high-frequency pulses are produced, the means for producing magnetic gradient fields being switched so that during each of these three 180° high-frequency pulses the gradient of the magnetic field extends in a different one of three orthogonal directions, and in that the computer is constructed so that it carries out a Fourier transformation with the sample values of the echo signals.

5. An arrangement as claimed in claim 4, characterized in that the control unit is constructed so that the time interval between the first high-frequency pulse and the succeeding 180° pulse can be varied from sequence to sequence, and in that the computer is constructed so that it carries out a Fourier transformation with those sample values of the echo signals from successive sequences, which each time have the same time interval from one of the 180° pulses.

* * * * *